(12) United States Patent
Xie et al.

(10) Patent No.: US 11,761,614 B2
(45) Date of Patent: Sep. 19, 2023

(54) LAMP WITH EASY ASSEMBLY AND DISASSEMBLY

(71) Applicant: Shenzhen Full Information Technology Co., Ltd., Shenzhen (CN)

(72) Inventors: Zhifu Xie, Shenzhen (CN); Qizhen Ma, Shenzhen (CN)

(73) Assignee: Shenzhen Full Information Technology Co., Ltd., Shenzhen (CN)

( * ) Notice: Subject to any disclaimer, the term of this patent is extended or adjusted under 35 U.S.C. 154(b) by 4 days.

(21) Appl. No.: 17/391,300

(22) Filed: Aug. 2, 2021

(65) Prior Publication Data

US 2022/0381424 A1 Dec. 1, 2022

(30) Foreign Application Priority Data

Jun. 1, 2021 (CN) .......................... 202121214090.6

(51) Int. Cl.
| | |
|---|---|
| *F21V 21/002* | (2006.01) |
| *F21V 23/06* | (2006.01) |
| *F21V 23/02* | (2006.01) |
| *F21V 23/04* | (2006.01) |
| *F21V 21/008* | (2006.01) |
| *H05K 5/00* | (2006.01) |
| *H05K 1/18* | (2006.01) |

(52) U.S. Cl.
CPC .......... *F21V 21/002* (2013.01); *F21V 23/023* (2013.01); *F21V 23/04* (2013.01); *F21V 23/06* (2013.01); *H05K 5/0069* (2013.01); *F21V 21/008* (2013.01); *H05K 1/18* (2013.01); *H05K 2201/10151* (2013.01); *H05K 2201/10189* (2013.01)

(58) Field of Classification Search
CPC ...... F21S 8/04; F21S 8/06; F21S 8/066; F21S 8/08; F21S 8/088; F21V 23/06; F21V 23/04; F21V 23/023; F21V 21/008; H05K 2201/0189; H05K 2201/10151; H05K 1/18

See application file for complete search history.

(56) References Cited

U.S. PATENT DOCUMENTS

| | | | |
|---|---|---|---|
| 10,727,621 B1* | 7/2020 | Senofsky | H01R 12/79 |
| 2008/0197702 A1* | 8/2008 | Banach | H02G 3/381 |
| | | | 307/11 |
| 2013/0249375 A1* | 9/2013 | Panagotacos | F21V 5/007 |
| | | | 313/15 |

FOREIGN PATENT DOCUMENTS

CN 110364876 A * 10/2019

\* cited by examiner

*Primary Examiner* — Anabel Ton
(74) *Attorney, Agent, or Firm* — Westbridge IP LLC

(57) ABSTRACT

Disclosed is a lamp with easy assembly and disassembly comprising a power socket and a lamp body. The power socket comprises a housing and a power supply assembly which is provided in the housing, the power supply assembly is connected with a power supply, the housing is provided with at least one mounting slot which is provided with a press-type locking socket and PCB probes, and the PCB probes are electrically connected with the power supply assembly, a mounting plug with an accommodating groove is provided on the lamp body, a press-type locking plug and a PCB board are provided in the mounting plug; the PCB board is electrically connected to the light source of the lamp body; when the mounting plug is inserted into the mounting slot, the push-type locking plug is inserted into the push-type locking socket and is locked.

13 Claims, 9 Drawing Sheets

LAMP WITH EASY ASSEMBLY AND DISASSEMBLY

CROSS-REFERENCE TO RELATED APPLICATIONS

This application claims priority to Chinese Patent Application No. 202121214090.6, filed on Jun. 1, 2021, the entire disclosure of which is hereby incorporated herein by reference.

TECHNICAL FIELD

The invention relates to the field of lighting lamps, in particular to a lamp with easy assembly and disassembly.

BACKGROUND

With the rapid development of production technology, energy-saving performance of an energy-saving lamp is rapidly improved, an application field of the energy-saving lamp is increasingly expanded, and the energy-saving lamp is the most commonly used lamp for indoor or outdoor lighting and home lighting.

At present, a modular structure has become a development trend of LED lamps, however, according to the existing lamp structure, modules are screwed by screws, so that the lamp assembly efficiency becomes low, and meanwhile, the advantages of the modular structure are not taken. When part of the lamp is damaged, the whole lamp needs to be disassembled with hard work, the lamp is inconvenient to replace and wire again, which brings inconvenience to use and maintenance of the lamp.

SUMMARY

The technical problem to be solved by the present invention is to provide a lamp that is secured and powered on by a flexible assemble and disassemble locking structure and pogo pins that allows the lamp to be flexibly assembled and disassembled and easily used.

In order to solve the technical problem, the following technical solution is adopted.

A lamp with easy assembly and disassembly comprises a power socket and a lamp body, wherein the power socket comprises a housing and a power supply assembly which is provided in the housing, the power supply assembly is connected with a power supply, the housing is provided with at least one mounting slot which is provided with a press-type locking socket and pogo pins, and the pogo pins are electrically connected with the power supply assembly, a mounting plug with an accommodating groove is provided on the lamp body, a press-type locking plug and a printed circuit board (PCB) board are provided in the mounting plug, and the PCB board is electrically connected with a light source of the lamp body;

when the mounting plug is inserted into the mounting slot, the press-type locking plug is inserted into the press-type locking socket to be locked, and the pogo pins are in contact conduction with the PCB board.

The invention has the beneficial effects that: a lamp body is provided as a power socket and a lamp body with a light source, the power supply is connected through the power socket, a mounting slot is provided on the power socket, a mounting plug is correspondingly provided on the lamp body, the lamp body is mounted on the power socket by inserting the plug into the slot to supply power for the lamp body, a press-type locking socket and pogo pins are provided in the mounting slot, and a press-type locking plug and a PCB board are provided in the mounting plug, and the press-type locking plug and the press-type locking socket constitute a press-type locking mechanism; when the mounting plug of the lamp body is inserted into the mounting slot of the power socket, the press-type locking plug in the mounting plug is inserted into the press-type locking socket in the mounting slot to be locked, so that the lamp body is firmly fixed on the power socket; and the pogo pins in the mounting slot are in contact with the contact point of the PCB board in the mounting plug so as to supply power for the lamp body, and the mounting of the lamp body is convenient and quick; pressing the lamp body into the mounting slot again, and the press-type locking plug popping out the press-type locking socket to unlock, so that the lamp body is separated from the power socket, and at the same time, the pogo pins are no longer in contact with the PCB board, so as to achieve flexible disassembly of the lamp body; and a plurality of mounting slots can be provided on the power socket, and the number of the lamp bodies can be arbitrarily increased or decreased, so that the overall brightness can be changed, etc. and it is more convenient and efficient to use the lamp.

DETAILED DESCRIPTION OF THE EMBODIMENTS

Figure 1:
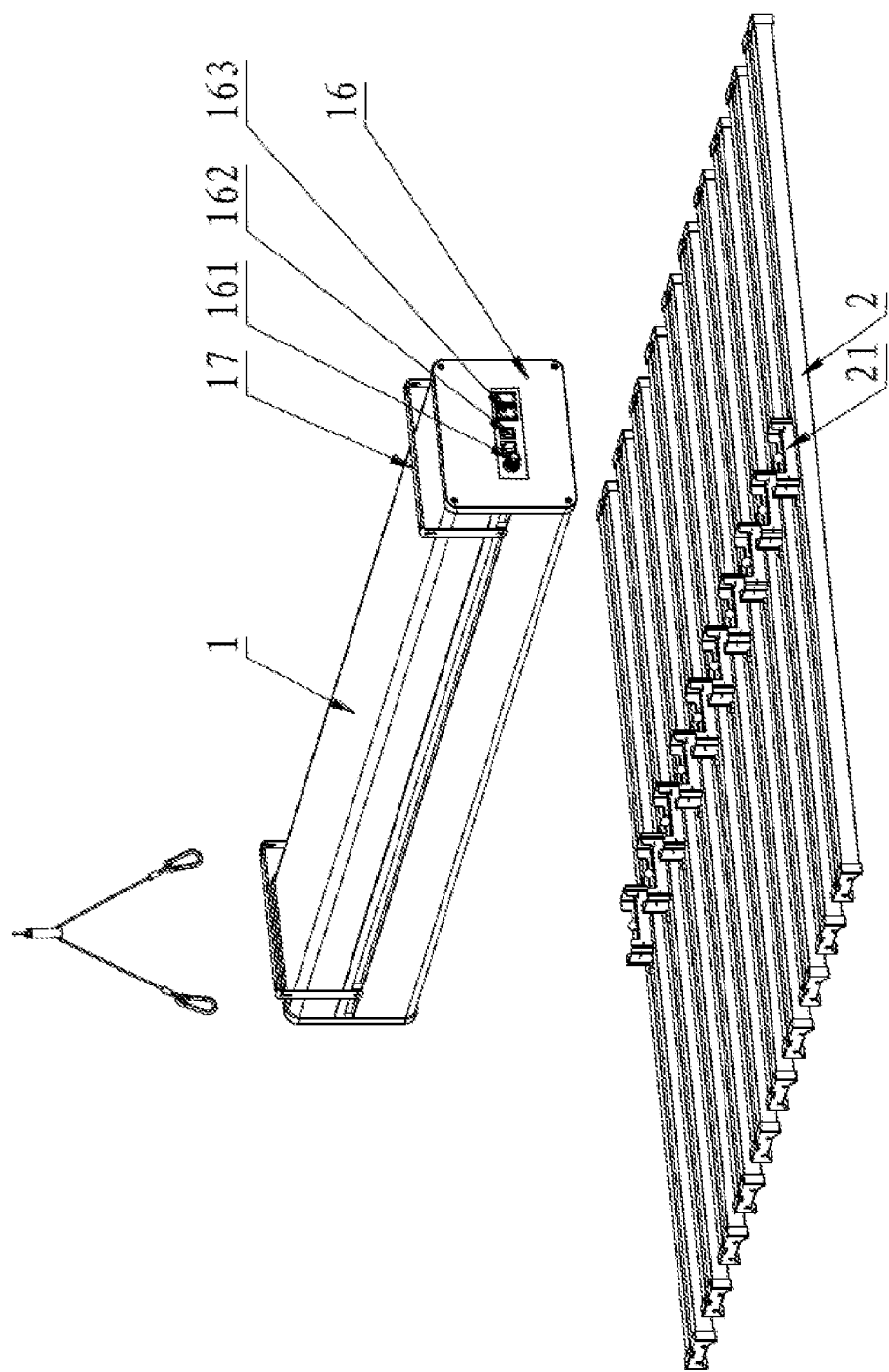
FIG. 1 is an assembly structure diagram of a lamp with easy assembly and disassembly according to an embodiment of the present invention.

In order to explain the technical contents, the objects, and the effects of the present invention in detail, the embodiments will be described below with reference to the accompanying drawings.

Referring to FIGS. 1 to 9, provided is a lamp with easy assembly and disassembly comprising a power socket and a lamp body, wherein the power socket comprises a housing and a power supply assembly which is provided in the housing. The power supply assembly is connected with a power supply. The housing is provided with at least one mounting slot which is provided with a press-type locking socket and pogo pins, and the pogo pins are electrically connected with the power supply assembly. A mounting plug with an accommodating groove is provided on the lamp body. A press-type locking plug and a PCB board are provided in the mounting plug, and the PCB board is electrically connected with a light source of the lamp body. When the mounting plug is inserted into the mounting slot, the press-type locking plug is inserted into the press-type locking socket to be locked, and the pogo pins are in contact conduction with the PCB board.

As can be seen from the above description, The invention has the beneficial effects that: a lamp body is provided as a power socket and a lamp body with a light source. The power supply is connected through the power socket. A mounting slot is provided on the power socket. A mounting plug is correspondingly provided on the lamp body. The lamp body is mounted on the power socket by inserting the plug into the slot to supply power for the lamp body. A press-type locking socket and pogo pins are provided in the mounting slot, and a press-type locking plug and a PCB board are provided in the mounting plug, and the press-type locking plug and the press-type locking socket constitute a press-type locking mechanism. When the mounting plug of the lamp body is inserted into the mounting slot of the power socket, the press-type locking plug in the mounting plug is inserted into the press-type locking socket in the mounting slot to be locked, so that the lamp body is firmly fixed on the power socket; and the pogo pins in the mounting slot are in contact with the contact point of the PCB board in the mounting plug so as to supply power for the lamp body. The mounting of the lamp body is convenient and quick: pressing the lamp body into the mounting slot again, and the press-type locking plug popping out the press-type locking socket to unlock, so that the lamp body is separated from the power socket, and at the same time, the pogo pins are no longer in contact with the PCB board, so as to achieve flexible disassembly of the lamp body. A plurality of mounting slots can be provided on the power socket, and the number of the lamp bodies can be arbitrarily increased or decreased, so that the overall brightness can be changed, etc. and it is more convenient and efficient to use the lamp.

Furthermore, the opposite side walls of the mounting slot are respectively provided with outward extending bosses. The press-type locking socket is mounted in the middle of the mounting slot, and the pogo pins are symmetrically mounted on the bosses. Further, the mounting slot and the mounting plug are symmetrical, and a buckle of the press-type locking socket and the press-type locking plug are respectively positioned on the symmetrical axes of the mounting slot and the mounting plug.

It can be seen from the above description that the shape of the mounting slot is designed to have the press-type locking socket mounted in the middle. Four pogo pins connected to form a rectangular shape are symmetrically provided on the boss at an edge of the press-type locking socket. The mounting plug of the lamp body and the mounting slot of the power socket are both symmetrically provided. The mounting plug of the lamp body can be inserted into the mounting slot of the power socket in a forward direction or a reverse direction, and both can lock the lamp body on the power socket and enable the pogo pins and the PCB board to conduct power for the lamp body.

Further, the press-type locking plug comprises a button cap, a button cover, a return spring, a return screw and a press-type locking retractor, wherein the button cover is fixed on one side of the lamp body away from the power socket. The button cover is provided between the button cover and the lamp body and is exposed from the middle of the button cover, and one end of a nut cap of the return screw is provided in the button cover.

The press-type locking retractor is provided in an accommodating groove of the mounting plug on one side, close to the power socket, of the lamp body, the press-type locking retractor comprises a ball stud and a bottom plate. The ball stud is vertically provided on the bottom plate. The PCB board is provided on one side, close to the power socket of the bottom plate. The middle of the PCB board is hollowed out, and a ball head of the ball stud is hollowed out and exposed from the middle of the PCB board.

A connecting stud extends from one side, facing away from the power socket, of the bottom plate, a top end of the connecting stud penetrates through the lamp body to be fixedly connected with a threaded shaft of the return screw. The return spring is sleeved on the connecting stud, and two ends of the return spring are respectively abutted against the lamp body and in the button cap.

As can be seen from the above description, a retractor of the press type locking plug is combined with the reset button switch, the button is provided on the other side of the lamp body opposite to a plug-in surface. After the mounting plug is inserted into the mounting slot corresponding to the mounting plug, the lamp body can be locked and ejected and disassembled by pressing the button, and the lamp is more flexible and convenient to assemble and disassemble.

Furthermore, a gasket is provided between the return spring and the lamp body.

As can be seen from the above description, a gasket is provided between the return spring and the lamp body, so that the contact of the return spring is more stable and not easy to shake, and the pressing and rebounding of the press-type locking retractor are smoother.

Furthermore, a through hole is formed in the bottom plate at a position adjacent to the ball stud. A guide pin facing the power socket is provided at the bottom of the accommodating groove of the mounting plug, and one end of the guide pin facing the power socket penetrates through the through hole to the hollowed-out position of the PCB board.

It can be seen from the above description that by arranging the guide pin to pass through the through hole in the base of the retractor, the movement of the retractor is guided, so that the ball stud of the retractor can be accurately inserted into the press type locking socket to be locked.

Further, the housing comprises an upper housing, a lower housing, a left end cover and a right end cover. The upper housing and the lower housing are both long groove-shaped. Long edges of the upper housing and the lower housing are clamped and encircled to form a long strip-shaped cavity, the mounting slot is provided in the lower housing. The left end cover and the right end cover are respectively provided at the left end and the right end of the upper housing and the lower housing after being clamped. A charging receptacle is provided on the left end cover, and the charging receptacle is electrically connected with the power supply assembly.

As can be seen from the above description, a power socket is designed in a rectangular shape. A mounting slot for mounting a lamp body is provided on a lower housing of a long slot shape. The power socket is connected with a power supply through a charging receptacle provided at the left end to electrify the power supply assembly, and the power socket is simple in structure, small in size and more convenient to mount.

Furthermore, at least three mounting slots are provided on the lower housing. All the mounting slots are uniformly provided along the length direction of the lower housing, and the lamp body is provided perpendicular to the power socket.

As can be seen from the above description, the lower housing is provided with a plurality of mounting slots which are uniformly provided along the length direction of the power socket. A plurality of lamp bodies can be inserted side by side at the same time. The lamp bodies with different numbers and intervals can also adjust the lighting effect of the lamp, and the lamp is more flexible and convenient to use.

Further, the power socket further comprises two U-shaped hanging rings which are mounted around the upper housing in parallel. The two side walls of the lower housing are oppositely provided with slots which are parallel to the length direction and close to the clamping long edges, and the U-shaped two ends of the two U-shaped hanging rings are mounted in the grooves through T-shaped nuts and can slide along the slots.

As can be seen from the above description, the power socket is provided with a hanging ring capable of slidably adjusting the position. The power socket can be hung and mounted through a retractor assembly. The power socket is relatively flexible and convenient to assemble and disassemble. The position of the hanging ring can be adjusted. The lamp can adapt to the stress of lamps under the mounting conditions of lamp bodies provided in different numbers and positions, and the lamp can be hung flexibly and conveniently.

Further, the right end cover is provided with a brightness adjusting knob, a network interface and a switch.

As can be seen from the above description, a brightness adjusting knob is provided on the right end cover to adjust the brightness of the lamp, and the lamp can be intelligently controlled by being connected with a modulator through a network interface.

Referring to FIGS. 1 to 9, the first embodiment of the present invention is as follows.

A lamp with easy assembly and disassembly comprises a power socket 1 and a lamp body 2. As shown in FIGS. 1-4, the power socket 1 comprises a housing 11 and a power supply assembly 12. The housing 11 comprises an upper housing 13, a lower housing 14, a left end cover 15 and a right end cover 16. The upper housing 13 and the lower housing 14 are both in a rectangular shape. The long sides of the upper housing 13 and the lower housing 14 are clamped and surrounded into an elongated cavity, and a mounting slot 141 is provided on the lower housing 14. A press-type locking socket 142 and four pogo pins 143 are provided in the mounting slot 141, and more than three mounts can be provided on the power socket 1 according to the embodiment. Ten mounting slots 141 are provided on the lower housing 14, so that various lighting effects can be provided to adapt to different environments. The left end cover 15 and the right end cover 16 are respectively provided at the left end and the right end after the upper housing 13 and the lower housing 14 are clamped, and the left end cover 15 is provided with a charging receptacle 151. The charging receptacle 151 is electrically connected to the power supply assembly 12. The right end cover 16 is provided with a brightness adjusting knob 161, a network interface 162, and a switch 163.

As shown in FIGS. 4 to 9, the opposite side walls of the mounting slot 141 are respectively provided with bosses extending toward the middle. The press-type locking socket 142 is mounted at the middle of the mounting slot 141. The four pogo pins 143 are symmetrically mounted on the bosses in pairs. The connecting lines of the four pogo pins 143 form a rectangle. The center of the rectangle coincides with the center of the mounting slot 141 and the insertion locking hole of the press-type locking socket 142. The pogo pin 143 is electrically connected with the power supply assembly 12. All the mounting slots 141 are uniformly provided along the length direction of the lower housing 14. The mounting directions of the mounting slots 141 are parallel, and the lamp body 2 is mounted perpendicular to the power socket 1.

As shown in FIGS. 1, 4-7 and 9, the lamp body 2 is provided with a mounting plug 21 with an accommodating groove. The mounting plug 21 is provided with a press-type locking plug 22 and a PCB board 23, and the PCB board 23 is electrically connected with a light source 24 of the lamp body 2.

As shown in FIGS. 4-7, the press-type locking plug 22 comprises a button cap 221, a button cover 222, a return spring 223, a return screw 224 and a press-type locking retractor 225, wherein the button cover 222 is fixed on a side of the lamp body 2 far away from the power socket 1, the button cap 221 is provided between the button cover 222 and the lamp body 2 and is exposed from the middle of the button cover 222, and one end of a nut cap of the return screw 224 is provided in the button cap 221;

the press-type locking retractor 225 is provided in an accommodating groove of the mounting plug 21 on one side, close to the power socket 1, of the lamp body 2, comprises a ball stud 2251 and a bottom plate 2252, wherein the ball stud 2251 is vertically provided in the center of the bottom plate 2252, the PCB board 23 is provided on one side, close to the power socket 1, of the bottom plate 2252, the middle of the PCB board 23 is hollowed out, and the ball stud of the ball stud 2251 is hollowed out and exposed from the center of the PCB board 23.

A connecting stud 2253 extends from one side, facing away from the power socket 1, of the bottom plate 2252. The top end of the connecting stud 2253 penetrates through the lamp body 2 and is fixedly connected with a threaded shaft of a return screw 224. A return spring 223 is sleeved on the connecting stud 2253. Two ends of the return spring 223 are respectively abutted against the lamp body 2 and in the button cap 221, and a gasket 226 is provided between the return spring 223 and the lamp body 2.

A through hole 2254 is formed in the bottom plate 2252 at a position adjacent to the ball stud 2251. A guide pin 211 facing the power socket 1 is provided at the bottom of the accommodating groove of the mounting plug 21, and one end of the guide pin 211 facing the power socket 1 penetrates through the through hole 2254 to the hollowed-out position of the PCB board 23.

The mounting slot 141 and the mounting plug 21 are symmetrical, and the buckle of the press-type locking socket 142 and the press-type locking plug 22 are respectively located on the symmetrical axes of the mounting slot 141 and the mounting plug 21, and preferably can be provided in a symmetrical shape with an approximate rectangular section. When the mounting plug 21 is inserted into the mounting slot 141, the press-type locking plug 22 is inserted into the press-type locking socket 142 to be locked, and the pogo pin 143 is in contact conduction with the PCB board 23.

Figure 2:
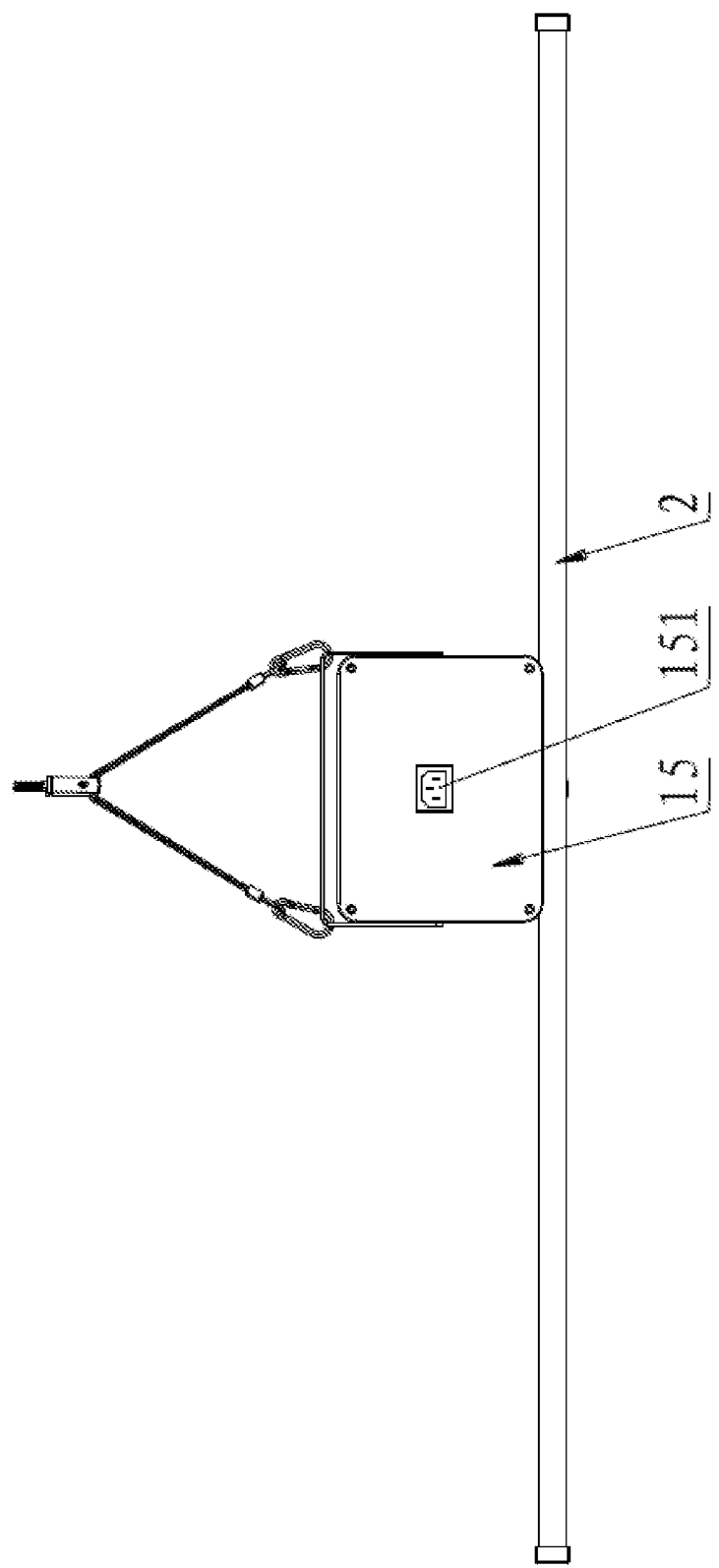
FIG. 2 is a left side view of a lamp with easy assembly and disassembly according to an embodiment of the present invention.
Figure 3:
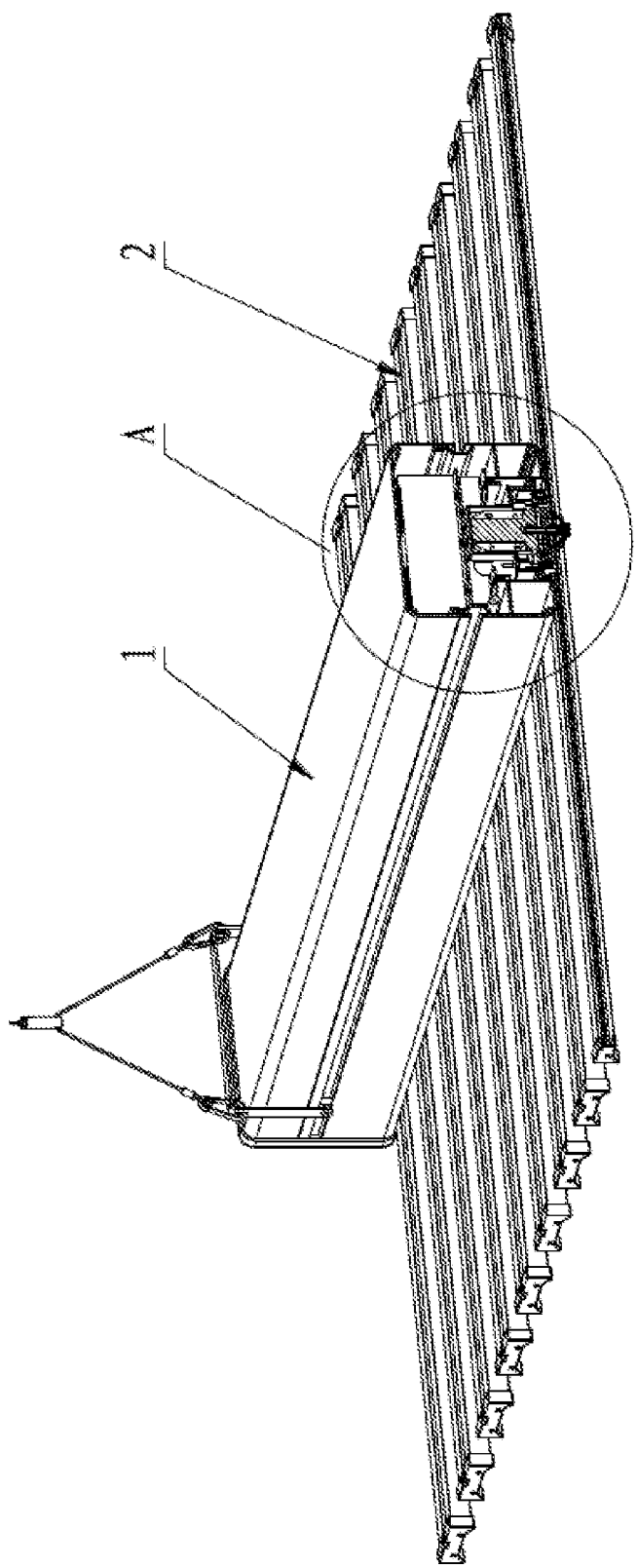
FIG. 3 is a schematic diagram showing an internal structure of a lamp with easy assembly and disassembly according to an embodiment of the present invention.
Figure 4:
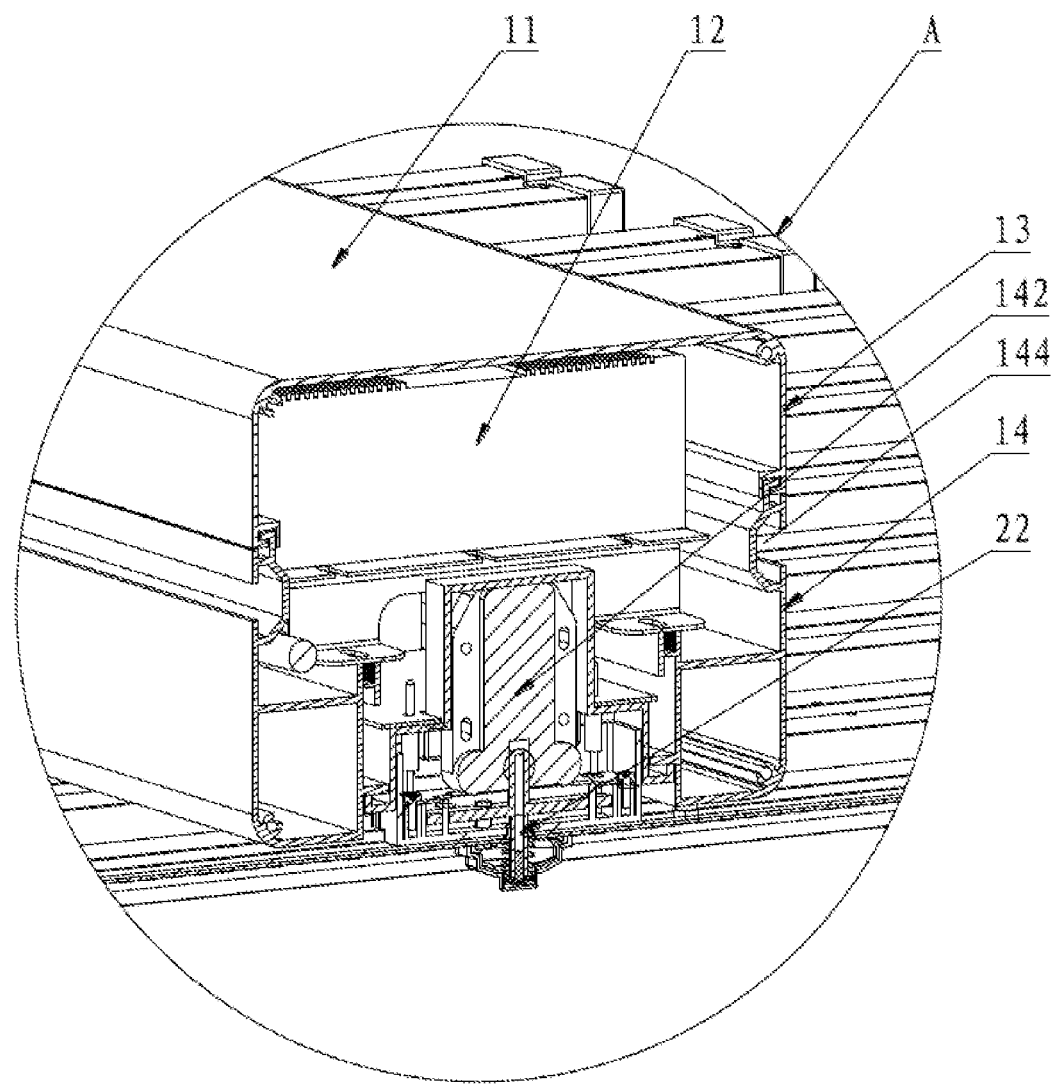
FIG. 4 is a partially enlarged view showing an internal structure of a lamp with easy assembly and disassembly according to an embodiment of the present invention.

As shown in FIGS. 1 and 2, the power socket 1 further comprises two U-shaped hanging rings 17 which are mounted around an upper housing 13 in parallel with each other, two side walls of the lower housing 14 are oppositely provided with slots 144 which are parallel to the length direction, and the U-shaped two ends of the two U-shaped hanging rings 17 are mounted in the grooves through T-shaped nuts and can slide along the slots 144.

The disassembly and assembly steps and principles of the lamp with easy assembly and disassembly are as follows.

As shown in FIG. 1, two U-shaped hanging rings 17 hung on a power socket 1 through a retractor assembly are hung up, and plugs of a power line are respectively connected into a power supply and a charging receptacle 151 on the power socket 1.

Figure 5:
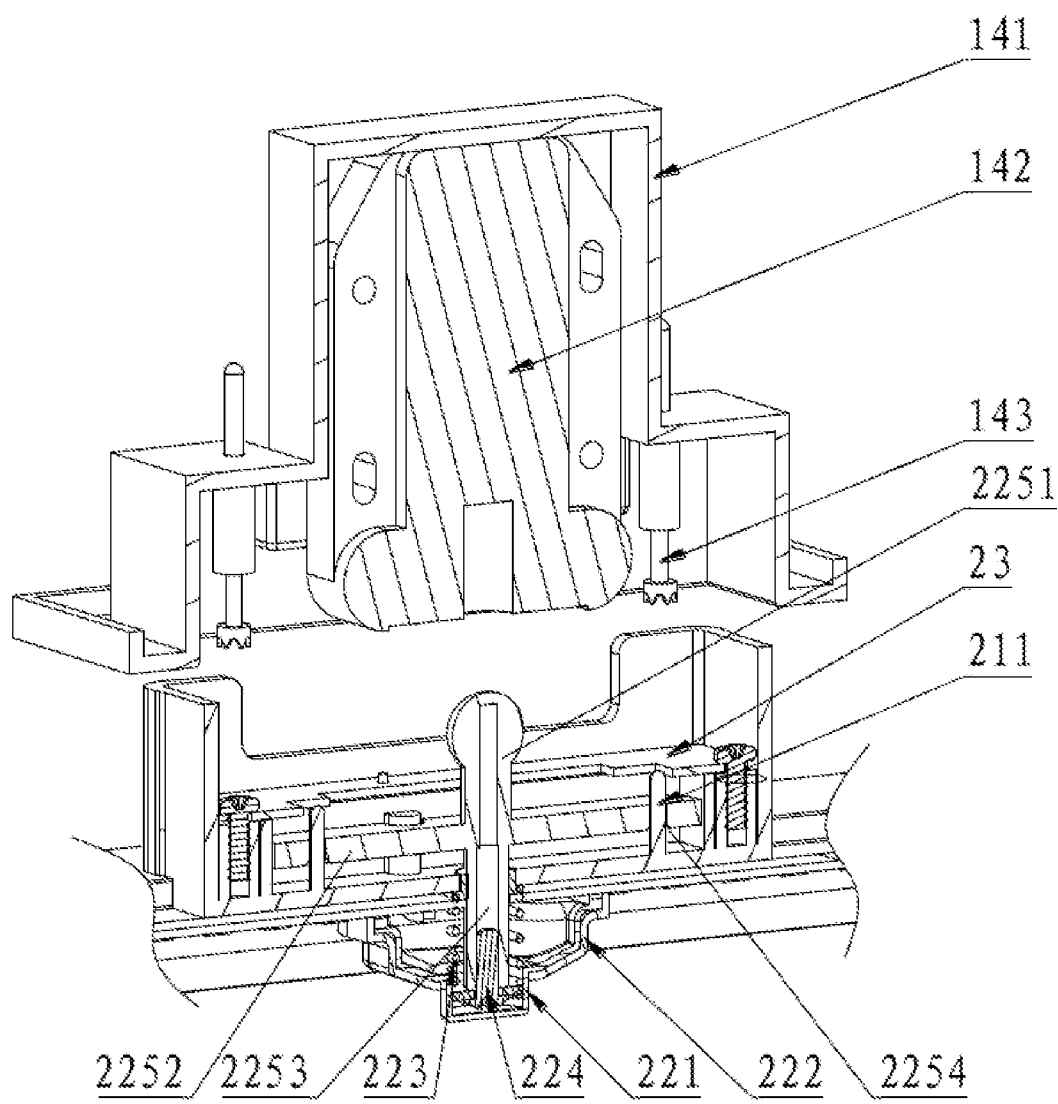
FIG. 5 is a schematic view showing a structure in which a mounting plug and a mounting slot of a lamp with easy assembly and disassembly according to an embodiment of the present invention are aligned.
Figure 6:
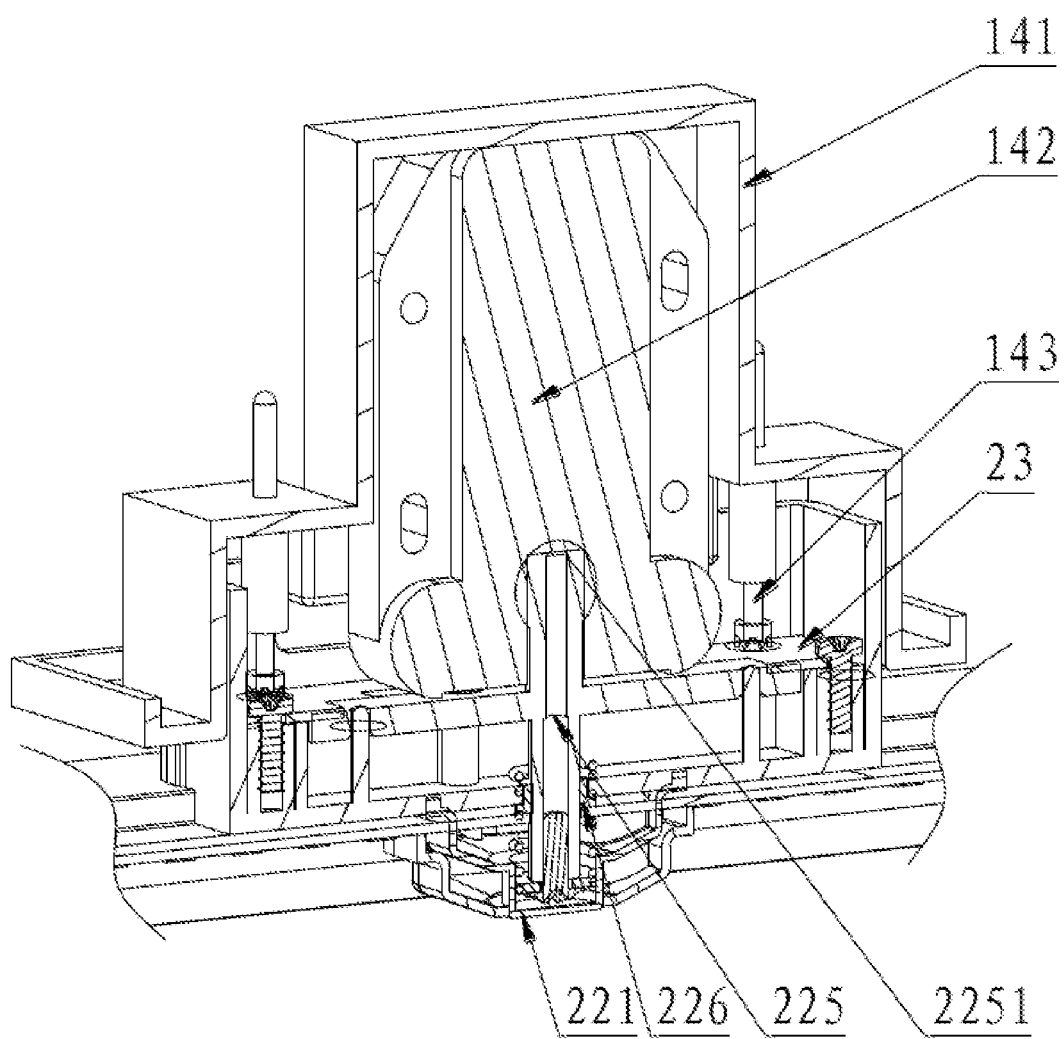
FIG. 6 is a schematic view showing a structure when a press button cap of a lamp with easy assembly and disassembly is mounted and locked or assembled and disassembled and unlocked according to an embodiment of the present invention.

When the lamp body 2 is mounted, as shown in FIG. 5, the lamp body 2 is perpendicular to the power socket 1. The mounting plug 21 on the lamp body 2 is aligned to the mounting slot 141 on the power socket 1 to be inserted, as shown in FIG. 6, and meanwhile, the button cap 221 on the lamp body 2 is pressed forcibly until the button cap 221 cannot be further deeply pressed, so that the pressing of the button cap 221 is removed; the lamp body 2 can be locked on the power socket 1 and energized, and different numbers of lamp bodies 2 can be mounted according to actual lighting requirements, and the positions where the lamp bodies 2 are mounted can also be arranged appropriately. A mounting slot 141 which is centrally mounted in the middle of a power socket 1 when five lamp bodies 2 are mounted or a mounting slot 141 which is vacant between two adjacent lamp bodies 2 is provided, the lamp bodies 2 can be inserted and used only by matching the shape of a mounting plug 21 with the mounting slot 141 when being mounted, and the plug 21 can be inserted and used only if the shape thereof matches that of the mounting slot 141. There is no need to distinguish forward and reverse mounting directions, in both of which the mounting can be carried out.

When the lamp body 2 is disassembled, the button cap 221 is pressed forcibly until the button cap 221 cannot be further penetrated, pressing of the button cap 221 is removed, the lamp body 2 can be disassembled from the power socket 1, and then the lamp body 2 is disassembled from the power socket 1.

Figure 7:
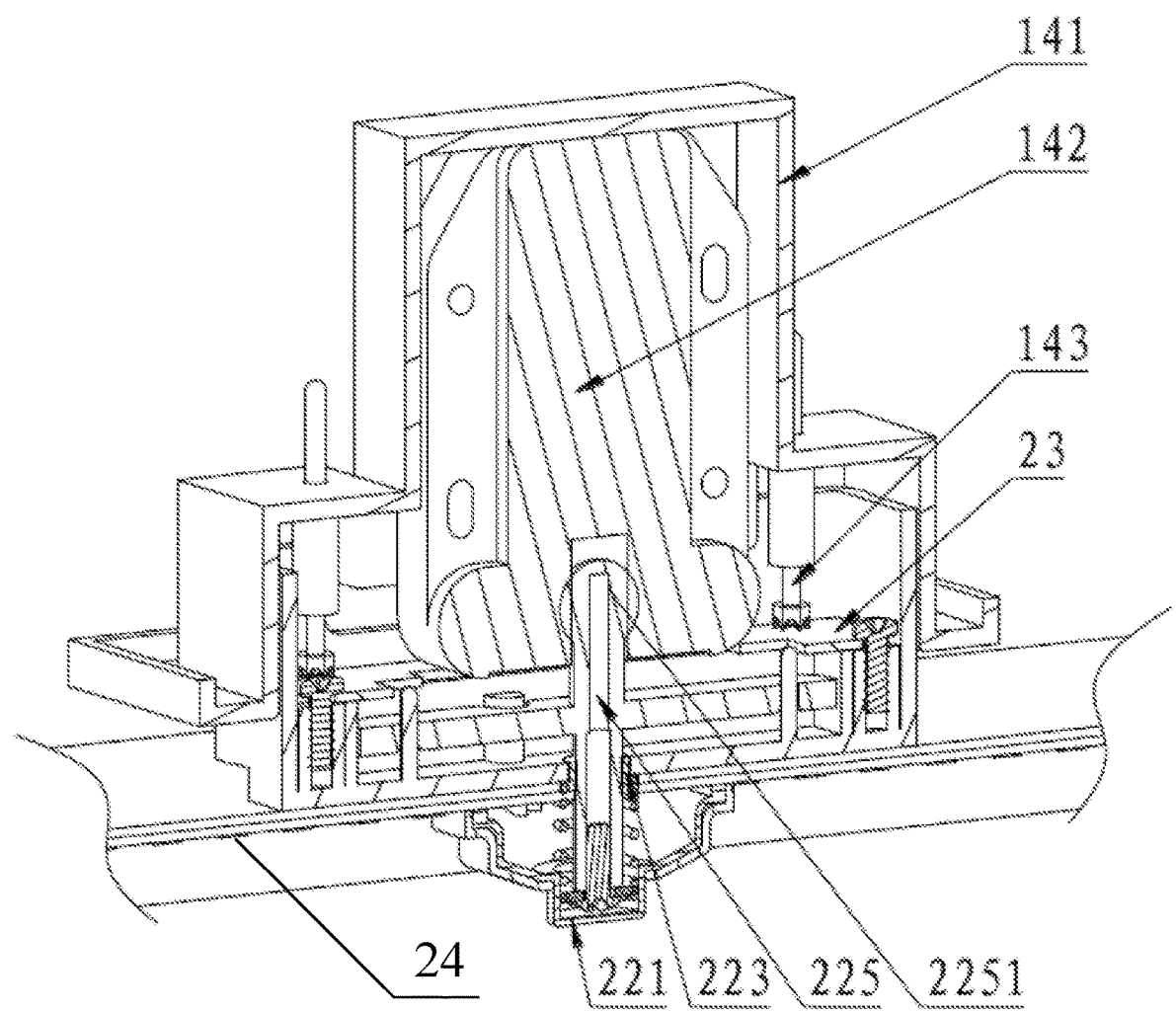
FIG. 7 is a schematic view showing a structure in a locking state of a mounting plug of a lamp body and a mounting slot of a power socket of a lamp with easy assembly and disassembly according to an embodiment of the present invention.
Figure 8:
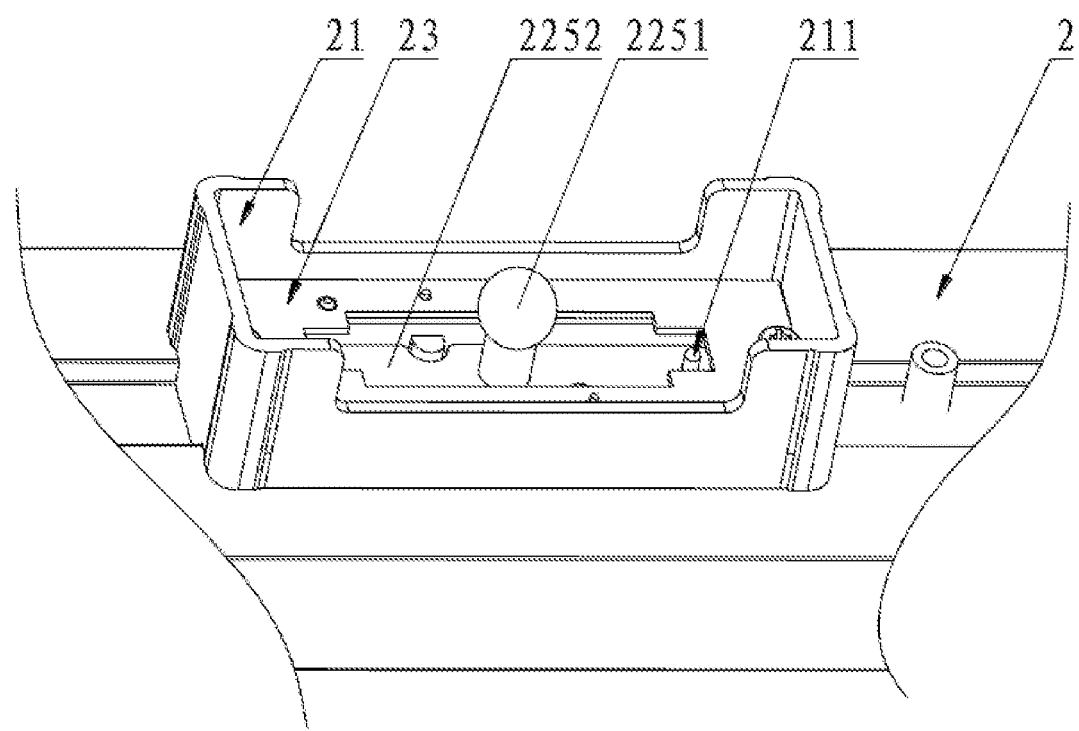
FIG. 8 is a schematic view showing a structure of a mounting plug on a lamp body of a lamp with easy assembly and disassembly according to an embodiment of the present invention.
Figure 9:
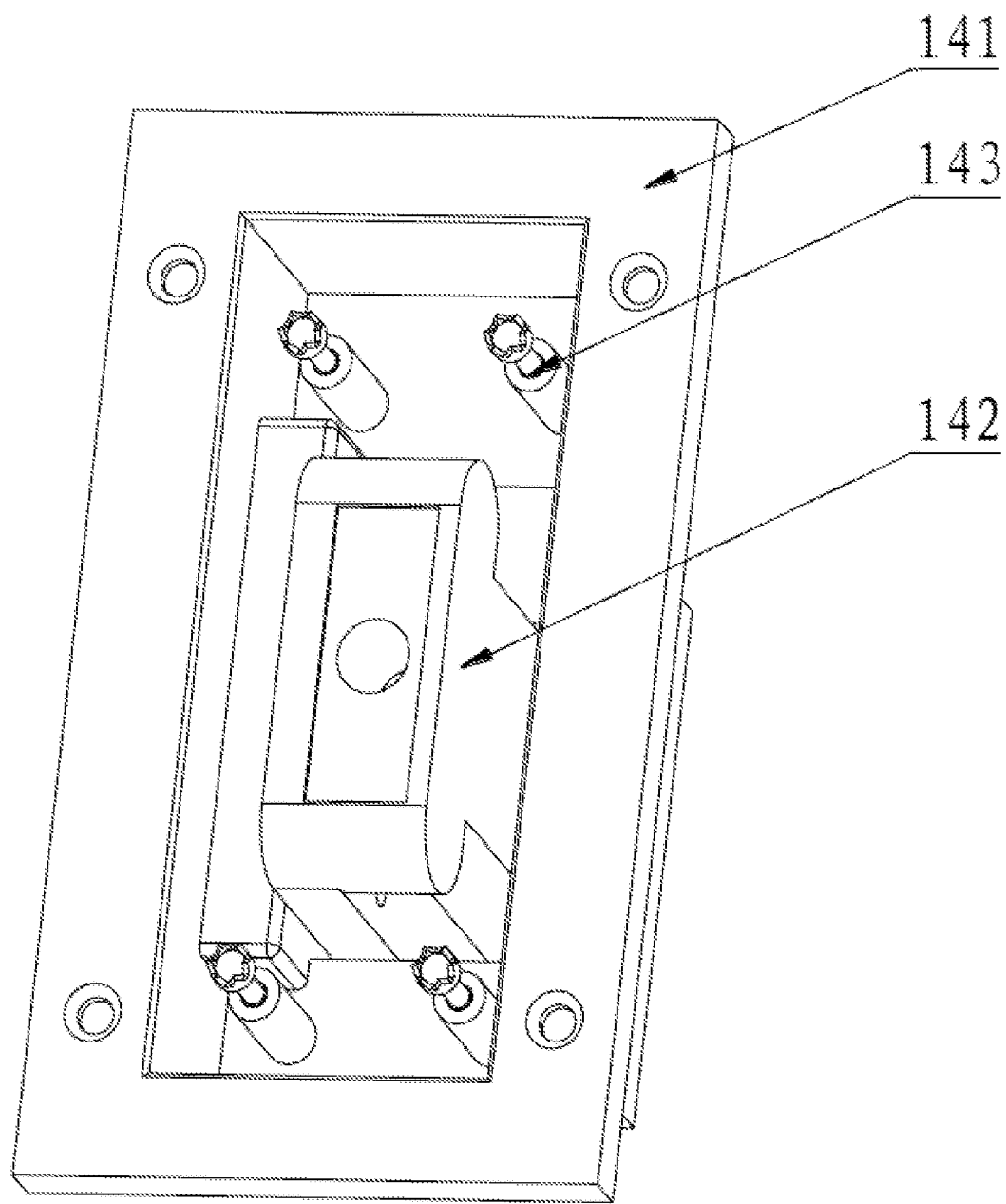
FIG. 9 is a schematic view showing a structure of a mounting slot of a power socket of a lamp with easy assembly and disassembly according to an embodiment of the present invention.

As shown in FIGS. 5 to 7, the disassembly and assembly of the lamp body 2 and the power socket 1 are realized by means of a press-type lock composed of the press-type locking plug 22 in the mounting plug 21 and the press-type locking socket 142 in the mounting slot 141. The press-type locking socket 142 and the press-type locking plug 22 can constitute a press-type self-locking structure similar to a crustacean door opening switch. When mounting, a button cap 221 is pressed, a spring is squeezed and a press-type locking retractor 225 is pressed, so that a ball stud 2251 is inserted into an insertion hole of the press-type locking socket 142 to reach the deepest part. When the button cap 221 is released, the pressing of the press-type locking retractor 225 is removed, and after the stroke of the press-type locking retractor 225 is retracted for a while, the ball head position of the press-type locking retractor 225 is locked and fixed by the press-type locking socket 142. At this moment, the four pogo pins 143 contact and conduct with corresponding contacts on the PCB board 23 to realize that the light source 24 on the lamp body 2 is powered on. When the button cap 221 is pressed again, the press-type locking retractor 225 is pressed again to reach the deepest part (the end of stroke) of the press-type locking socket 142, the press-type locking socket 142 releases the ball head of the press-type locking retractor 225, and the press-type locking retractor 225 returns to the initial position driven by the connecting stud 2253 and the reset screw 224 and the return spring 223. The lamp body 2 can be disengaged from the power socket 1 by unlocking.

In summary, the lamp provided by the invention is provided with a power socket with a plurality of mounting slots and a mounting plug lamp body with corresponding mounting slots, the lamp body is locked on the power socket by arranging a press-type self-locking mechanism in the mounting slots and the mounting plugs, meanwhile, the pogo pins are used for contacting the PCB board to conduct electricity, and the pogo pins and the PCB board are respectively provided in the mounting slots and the mounting plugs. At the same time of mounting and locking, realizing that the light source of the lamp body is connected to the power source of the power socket to conduct power supply, the press-type self-locking mechanism presses to lock and then the lamp body is made to be disassembled flexibly in a fixed manner of unlocking, and the conduction of the power source is combined in the mounting and locking process, the lamp body is used once plugged, the disassembly is flexible and convenient, and a plurality of mounting slots are provided on the power socket so as to arbitrarily adjust the number and mounting position of the lamp bodies; the power socket can be hung by the hanging ring of the power source through the retractor, and the assembly and disassembly of the power socket is also very flexible, more convenient and practical to use.

While the foregoing is directed to embodiments of the present invention, other and further embodiments of the invention may be devised without departing from the basic scope thereof, and the scope thereof is determined by the claims that follow.

What is claimed is:

1. A lamp with easy assembly and disassembly, comprising a power socket and a lamp body;
    wherein the power socket comprises a housing and a power supply assembly which is provided in the housing, the power supply assembly is connected with a power supply, the housing is provided with at least one mounting slot which is provided with a press-type locking socket and pogo pins, and the pogo pins are electrically connected with the power supply assembly, a mounting plug with an accommodating groove is provided on the lamp body, a press-type locking plug and a printed circuit board (PCB) board are provided in the mounting plug, and the PCB is electrically connected with a light source of the lamp body;
    when the mounting plug is inserted into the mounting slot, the press-type locking plug is inserted into the press-type locking socket to be locked, and the pogo pins are in contact conduction with the PCB board;
    wherein opposite side walls of the mounting slot are respectively provided with outward extending bosses, the press-type locking socket is mounted in the middle of the mounting slot, and the pogo pins are symmetrically mounted on the bosses.

2. The lamp as claimed in claim 1, wherein the mounting slot and the mounting plug are symmetrical, and a buckle of the press-type locking socket and the press-type locking plug are respectively positioned on the symmetrical axes of the mounting slot and the mounting plug.

3. The lamp as claimed in claim 1, wherein the press-type locking plug comprises a button cap, a button cover, a return spring, a return screw and a press-type locking retractor, wherein the button cover is fixed on one side of the lamp body away from the power socket, the button cover is provided between the button cover and the lamp body and is exposed from the middle of the button cover, and one end of a nut cap of the return screw is provided in the button cover;

the press-type locking retractor is provided in an accommodating groove of the mounting plug on one side, close to the power socket, of the lamp body, the press-type locking retractor comprises a ball stud and a bottom plate, the ball stud is vertically provided on the bottom plate, the PCB board is provided on one side, close to the power socket, of the bottom plate, the middle of the PCB board is hollowed out, and a ball head of the ball stud is hollowed out and exposed from the middle of the PCB board; and a connecting stud extends from one side, facing away from the power socket, of the bottom plate, a top end of the connecting stud penetrates through the lamp body to be fixedly connected with a threaded shaft of the return screw, the return spring is sleeved on the connecting stud, and two ends of the return spring are respectively abutted against the lamp body and in the button cap.

4. The lamp as claimed in claim 3, wherein a gasket is provided between the return spring and the lamp body.

5. The lamp as claimed in claim 3, wherein a through hole is formed in the bottom plate at a position adjacent to the ball stud, a guide pin facing the power socket is provided at the bottom of the accommodating groove of the mounting plug, and one end of the guide pin facing the power socket penetrates through the through hole to the hollowed-out position of the PCB board.

6. The lamp as claimed in claim 1, wherein the press-type locking plug comprises a button cap, a button cover, a return spring, a return screw and a press-type locking retractor, wherein the button cover is fixed on one side of the lamp body away from the power socket, the button cover is provided between the button cover and the lamp body and is exposed from the middle of the button cover, and one end of a nut cap of the return screw is provided in the button cover;

the press-type locking retractor is provided in an accommodating groove of the mounting plug on one side, close to the power socket, of the lamp body, the press-type locking retractor comprises a ball stud and a bottom plate, the ball stud is vertically provided on the bottom plate, the PCB board is provided on one side, close to the power socket, of the bottom plate, the middle of the PCB board is hollowed out, and the ball head of the ball stud is hollowed out and exposed from the middle of the PCB board; and a connecting stud extends from one side, facing away from the power socket, of the bottom plate, a top end of the connecting stud penetrates through the lamp body to be fixedly connected with a threaded shaft of the return screw, the return spring is sleeved on the connecting stud, and two ends of the return spring are respectively abutted against the lamp body and in the button cap.

7. The lamp as claimed in claim 2, wherein the press-type locking plug comprises a button cap, a button cover, a return spring, a return screw and a press-type locking retractor, wherein the button cover is fixed on one side of the lamp body away from the power socket, the button cover is provided between the button cover and the lamp body and is exposed from the middle of the button cover, and one end of a nut cap of the return screw is provided in the button cover;

the press-type locking retractor is provided in an accommodating groove of the mounting plug on one side, close to the power socket, of the lamp body, the press-type locking retractor comprises a ball stud and a bottom plate, the ball stud is vertically provided on the bottom plate, the PCB board is provided on one side, close to the power socket, of the bottom plate, the middle of the PCB board is hollowed out, and the ball head of the ball stud is hollowed out and exposed from the middle of the PCB board; and a connecting stud extends from one side, facing away from the power socket, of the bottom plate, a top end of the connecting stud penetrates through the lamp body to be fixedly connected with a threaded shaft of the return screw, the return spring is sleeved on the connecting stud, and two ends of the return spring are respectively abutted against the lamp body and in the button cap.

8. The lamp as claimed in claim 7, wherein a gasket is provided between the return spring and the lamp body.

9. The lamp as claimed in claim 8, wherein a through hole is formed in the bottom plate at a position adjacent to the ball stud, a guide pin facing the power socket is provided at the bottom of the accommodating groove of the mounting plug, and one end of the guide pin facing the power socket penetrates through the through hole to the hollowed-out position of the PCB board.

10. The lamp as claimed in claim 1, wherein the housing comprises an upper housing, a lower housing, a left end cover and a right end cover, the upper housing and the lower housing are both long groove-shaped, long edges of the upper housing and the lower housing are clamped and encircled to form a long strip-shaped cavity, the mounting slot is provided in the lower housing, the left end cover and the right end cover are respectively provided at the left end and the right end of the upper housing and the lower housing after being clamped, a charging receptacle is provided on the left end cover, and the charging receptacle is electrically connected with the power supply assembly.

11. The lamp as claimed in claim 10, wherein at least three mounting slots are provided on the lower housing, all the mounting slots are uniformly provided along the length direction of the lower housing, and the lamp body is provided perpendicular to the power socket.

12. The lamp as claimed in claim 10, wherein the power socket further comprises two U-shaped hanging rings which are mounted around the upper housing in parallel, the two side walls of the lower housing are oppositely provided with slots which are parallel to the length direction and close to the clamping long edges, and the U-shaped two ends of the two U-shaped hanging rings are mounted in the grooves through T-shaped nuts and can slide along the slots.

13. The lamp as claimed in claim 10, wherein the right end cover is provided with a brightness adjusting knob, a network interface and a switch.

\* \* \* \* \*